(12) United States Patent
Zhou et al.

(10) Patent No.: US 10,312,294 B2
(45) Date of Patent: Jun. 4, 2019

(54) DISPLAY SUBSTRATE, DISPLAY PANEL AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Cuirong Zhou, Beijing (CN); Guiyang Yu, Beijing (CN); Yufei Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/511,127

(22) PCT Filed: Aug. 12, 2016

(86) PCT No.: PCT/CN2016/094987
§ 371 (c)(1),
(2) Date: Mar. 14, 2017

(87) PCT Pub. No.: WO2017/084396
PCT Pub. Date: May 26, 2017

(65) Prior Publication Data
US 2017/0278903 A1 Sep. 28, 2017

(30) Foreign Application Priority Data
Nov. 18, 2015 (CN) .......................... 2015 1 0796793

(51) Int. Cl.
G02F 1/133 (2006.01)
H01L 27/32 (2006.01)
(Continued)

(52) U.S. Cl.
CPC .......... *H01L 27/3211* (2013.01); *G02F 1/133* (2013.01); *G02F 1/133514* (2013.01);
(Continued)

(58) Field of Classification Search
CPC ... G02F 1/133514; G02F 2001/136222; G02F 2201/52; G02F 1/136209; G02F 1/133512;
(Continued)

(56) References Cited

U.S. PATENT DOCUMENTS

2005/0275777 A1   12/2005  Oizumi et al.
2015/0091953 A1*  4/2015   Wu ..................... G09G 3/2007
                                                          345/690
(Continued)

FOREIGN PATENT DOCUMENTS

CN        1707337 A       12/2005
CN      202649645 U        1/2013
(Continued)

OTHER PUBLICATIONS

International Search Report and Written Opinion dated Nov. 7, 2016; PCT/CN20161094987.
(Continued)

*Primary Examiner* — Jia X Pan
(74) *Attorney, Agent, or Firm* — Ladas & Parry LLP

(57) ABSTRACT

A display substrate, a display panel and a display apparatus are provided. The display substrate includes a plurality of sub pixel units, the plurality of sub pixel units is arranged in an array, each row or each column of sub pixels includes a first sub pixel and a second sub pixel, a line segment formed by the row of sub pixels has a midpoint in a row direction or a line segment formed by the column of sub pixels has a midpoint in a column direction, the first sub pixel and the second sub pixel are configured for displaying a same color,
(Continued)

a distance from the first sub pixel to the midpoint is less than a distance from the second sub pixel to the midpoint and an aperture area of the first sub pixel is greater than that of the second sub pixel.

17 Claims, 7 Drawing Sheets

(51) Int. Cl.
  *G02F 1/1335* (2006.01)
  *G09F 9/302* (2006.01)
  *H01L 51/50* (2006.01)
(52) U.S. Cl.
  CPC ............ *G09F 9/302* (2013.01); *H01L 27/322* (2013.01); *H01L 51/5012* (2013.01); *G02F 2201/52* (2013.01); *H01L 27/3218* (2013.01)
(58) Field of Classification Search
  CPC .................. G02F 1/133; G09G 3/2003; G09G 2300/0452; G09G 2300/0443; G09G 3/3607; G09G 3/3611; G09G 5/02; G02B 5/201; H01L 27/322; H01L 27/3213; H01L 27/3218; H01L 27/3211
  See application file for complete search history.

(56) References Cited

U.S. PATENT DOCUMENTS

| | | | |
|---|---|---|---|
| 2015/0097837 A1* | 4/2015 | Jepsen | .................. G06F 3/1446 |
| | | | 345/428 |
| 2016/0085113 A1 | 3/2016 | Zheng | |
| 2016/0187734 A1 | 6/2016 | He | |
| 2016/0246120 A1 | 8/2016 | Nan et al. | |

FOREIGN PATENT DOCUMENTS

| | | | |
|---|---|---|---|
| CN | 203941361 U | | 11/2014 |
| CN | 104267518 A | | 1/2015 |
| CN | 104483785 A | | 4/2015 |
| CN | 105242439 A | | 1/2016 |
| CN | 205103519 U | | 3/2016 |
| JP | 2013-015680 A | | 1/2013 |
| JP | 2013015680 A | * | 1/2013 |
| JP | 2015-049391 A | | 3/2015 |

OTHER PUBLICATIONS

The First Chinese Office Action dated Nov. 29, 2017; Appl. No. 201510796793.7.

* cited by examiner

DISPLAY SUBSTRATE, DISPLAY PANEL AND DISPLAY APPARATUS

TECHNICAL FIELD

At least one embodiment of the present disclosure relates to a display substrate, a display panel and a display apparatus.

BACKGROUND

Currently, in a case that various display apparatuses with display panels are higher in performance and more stable generation by generation, lower power consumption and longer standby time become a development direction.

SUMMARY

At least one embodiment of the present disclosure provides a display substrate, a display panel and a display apparatus so as to promote transmittance of a center region of the display panel and fulfill the aims of promoting brightness of the center region and reducing power consumption.

At least one embodiment of the invention provides a display substrate, comprising a base substrate and a plurality of sub pixel units arranged on the base substrate, wherein the plurality of sub pixel units is arranged in an array, and the array includes a plurality of rows and a plurality of columns, each row or each column of sub pixels includes a first sub pixel and a second sub pixel, a line segment formed by the row of sub pixels has a midpoint in a row direction or a line segment formed by the column of sub pixels has a midpoint in a column direction, the first sub pixel and the second sub pixel are configured for displaying a same color, a distance from the first sub pixel to the midpoint is less than a distance from the second sub pixel to the midpoint, and an aperture area of the first sub pixel is greater than that of the second sub pixel.

For example, in the display substrate provided in an embodiment of the invention, in each row of sub pixels, from a position close to the midpoint in the row direction to a position away from the midpoint in the row direction, or in each column of sub pixels, from a position close to the midpoint in the column direction to a position away from the midpoint in the column direction, the aperture areas of the sub pixels for displaying a same color are gradually reduced.

For example, in the display substrate provided in an embodiment of the invention, in each row of sub pixels, from the position close to the midpoint in the row direction to the position away from the midpoint in the row direction, or in each column of sub pixels, from the position close to the midpoint in the column direction to the position away from the midpoint in the column direction, the aperture areas of the sub pixels for displaying the same color are reduced in an arithmetic progression mode.

For example, in the display substrate provided in an embodiment of the invention, in each row or each column of sub pixels, the first sub pixel and the second sub pixel are sub pixels which are next to each other and are configured for displaying the same color.

For example, in the display substrate provided in an embodiment of the invention, in each row of sub pixels, the first sub pixel and the second sub pixel are positioned on a same side of the midpoint in the row direction, or in each column of sub pixels, the first sub pixel and the second sub pixel are positioned on a same side of the midpoint in the column direction, at least one intermediate sub pixel for displaying the same color with the first sub pixel and the second sub pixel is arranged between the first sub pixel and the second sub pixel, and an aperture area of the at least one intermediate sub pixel is the same with that of the first sub pixel or the second sub pixel.

For example, in the display substrate provided in an embodiment of the invention, in each row or each column of sub pixels, a ratio of an aperture area of the sub pixel unit with a minimum aperture area to an aperture area of the sub pixel unit with a maximum aperture area, which is configured for displaying the same color, is greater than or equal to 0.8 and less than 1.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a line segment formed by the column of sub pixels has a midpoint in the column direction, the third sub pixel and the fourth sub pixel are configured for displaying a same color, a distance from the third sub pixel to the midpoint in the column direction is less than a distance from the fourth sub pixel to the midpoint in the column direction, an aperture area of the third sub pixel is greater than that of the fourth sub pixel.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a distance from the third sub pixel to the midpoint in the column direction is less than a distance from the fourth sub pixel to the midpoint in the column direction, an aperture area of the third sub pixel is greater than that of the fourth sub pixel, in each column of sub pixels, from a position close to the midpoint in the column direction to a position away from the midpoint in the column direction, the aperture areas of the sub pixels for displaying the same color are gradually reduced.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a distance from the third sub pixel to the midpoint in the column direction is less than a distance from the fourth sub pixel to the midpoint in the column direction, an aperture area of the third sub pixel is greater than that of the fourth sub pixel, in each column of sub pixels, from the position close to the midpoint in the column direction to the position away from the midpoint in the column direction, the aperture areas of the sub pixels for displaying the same color are gradually reduced in an arithmetic progression mode.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a distance from the third sub pixel to the midpoint in the column direction is less than a distance from the fourth sub pixel to the midpoint in the column direction, an aperture area of the third sub pixel is greater than that of the fourth sub pixel, in each column of sub pixels, the third sub pixel and the fourth sub pixel are sub pixels which are next to each other and are configured for displaying the same color.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a distance from the third sub pixel to the midpoint in the column direction is less than a distance from the fourth sub pixel to the midpoint in the column direction, an aperture area of the third sub pixel is greater than that of the fourth sub pixel, in each column of sub pixels, the third sub pixel and the fourth sub pixel are positioned on a same side of the midpoint in the column direction, at least one intermediate sub pixel for displaying the same color with the third sub pixel and the fourth sub pixel is arranged between the third sub pixel and the fourth sub pixel, and an aperture area of the at least one intermediate sub pixel is the same with that of the third sub pixel or the fourth sub pixel.

For example, in the display substrate provided in an embodiment of the invention, each row of sub pixels includes the first sub pixel and the second sub pixel, the distance from the first sub pixel to the midpoint in the row direction is less than the distance from the second sub pixel to the midpoint in the row direction, an aperture area of the first sub pixel is greater than that of the second sub pixel, each column of sub pixels includes a third sub pixel and a fourth sub pixel, a distance from the third sub pixel to the midpoint in the column direction is less than a distance from the fourth sub pixel to the midpoint in the column direction, an aperture area of the third sub pixel is greater than that of the fourth sub pixel, in each column of sub pixels, a ratio of an aperture area of the sub pixel unit with a minimum aperture area to an aperture area of the sub pixel unit with a maximum aperture area, which is configured for displaying the same color, is greater than or equal to 0.8 and less than 1.

For example, the display substrate provided by an embodiment of the invention further comprises black matrices for separating the sub pixel units, wherein the black matrices have a same width.

For example, in the display substrate provided in an embodiment of the invention, the aperture areas of the adjacent sub pixel units for displaying different colors are the same or different.

For example, in the display substrate provided in an embodiment of the invention, the display substrate is an array substrate or a color filter substrate.

At least one embodiment of the invention provides a display panel, comprising any display substrate as mentioned above.

For example, the display panel provided by an embodiment of the invention is a liquid crystal display panel or an organic electroluminescent diode display panel.

At least one embodiment of the invention provides a display apparatus, comprising any display substrate as mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

Figure 1A:
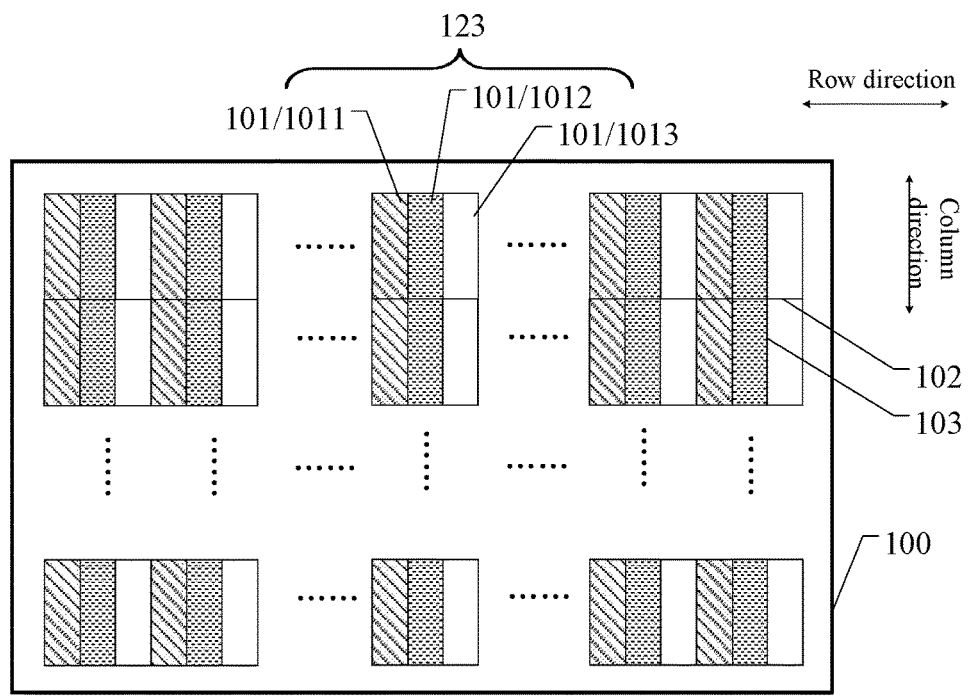
FIG. 1*a* is a schematic diagram of pixel design of a display substrate (array substrate)

100—base substrate; 101—sub pixel unit; 123—pixel unit; 1011—red sub pixel; 1012—green sub pixel; 1013—blue sub pixel; 102—gate line; 103—data line; 104—black matrix; 105—midpoint in row direction; 106—midpoint in column direction; 1121-1128: green sub pixels; 1231—first pixel unit; 1232—second pixel unit; 11—sub pixel unit group; 111-113: sub pixel unit group; 14—pixel unit group; 141-143: pixel unit group; 15—sub pixel unit group; 151-152: sub pixel unit group.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

For various different client terminals with a display apparatus, a viewing angle of a user is generally further focused on a center region of a display panel, but the user generally does not pay attention to a portion away from the center region of the display panel, i.e., a brightness requirement of a periphery of the display panel is possibly lower than that of a center position. However, in a general pattern design solution of pixel units, all the pixel units are uniformly arranged in an active display region, all sub pixels have the same width/height, and the display region of the entire panel is uniform and consistent in transmittance, which generate unnecessary brightness waste and are unbeneficial for reducing power consumption and prolonging standby time.

Figure 1B:
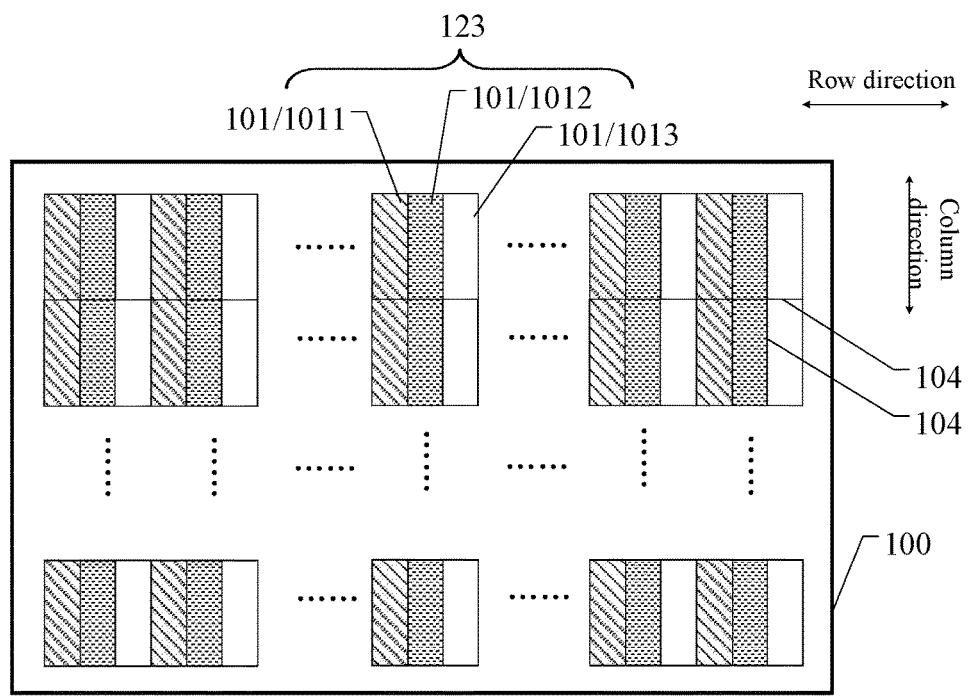
FIG. 1*b* is a schematic diagram of pixel design of a display substrate (color filter substrate)

FIG. 1a and FIG. 1b are schematic diagrams of pixel design of a display substrate. The display substrate includes: a base substrate 100, and a plurality of pixel units 123 arranged on the base substrate 100 in an array. Each pixel unit 123 includes a plurality of sub pixel units 101 and for example, includes three sub pixels: a red sub pixel 1011, a green sub pixel 1012 and a blue sub pixel 1013; each red sub pixel 1011, each green sub pixel 1012 and each blue sub pixel 1013 respectively have equal heights and equal widths; and the red sub pixel 1011, the green sub pixel 1012 and the blue sub pixel 1013 have the same aperture area. The equal height means an equal length in a column direction, and the equal width means an equal length in a row direction, with which each embodiment below can be the same. For example, the array formed by a plurality of pixel units can be a matrix in which all rows and all columns are aligned with each other, and also can be in an arrangement mode that all the rows and all the columns are staggered mutually by a width or height of half a sub pixel for example, with which each embodiment below can be the same.

As illustrated in FIG. 1a, the display substrate is an array substrate, a gate line 102 is arranged between two sub pixel units 101 adjacent in the column direction, and a data line 103 is arranged between two sub pixel units 101 adjacent in the row direction. For example, the gate line 102 extends along the row direction, and the data line 103 extends along the column direction. For example, a plurality of gate lines 102 and a plurality of data lines 103 intersect with each other to define a plurality of sub pixel units.

As illustrated in FIG. 1b, the display substrate is a color filter substrate. For example, the color filter substrate includes black matrices and color resin layers, light emerges via the color resin layer of each sub pixel to form light with a corresponding color, a black matrix 104 can be arranged between two sub pixel units 101 adjacent in the column direction, and the black matrix 104 is also arranged between two sub pixel units 101 adjacent in the row direction. Namely, the black matrix is arranged between two adjacent sub pixels, and the black matrix is used for shading light to prevent crosstalk and improve contrast. For example, the black matrices 104 in the row direction have the same width, and the black matrices 104 in the column direction have the same width. For example, further, the black matrices 104 in the row direction and the black matrices 104 in the column direction have the same width. The width means a length perpendicular to an extension direction of the black matrices.

For example, in a liquid crystal display apparatus, a display substrate controls pixel electrodes and common electrodes by signal lines to form different electric fields for controlling arrangement of liquid crystal molecules in a liquid crystal layer, so as to control light transmitting each sub pixel and finally enable the sub pixels with different colors in the pixel units to have different brightness. Three different colors light in each pixel unit are mixed according to different ratios as required, so that each pixel unit shows a different color, thereby implementing color display. Brightness of a pixel region is one of important factors for ensuring a display effect, and improvement on an aperture area and an aperture ratio of the pixels is an important step to ensure improvement of the display effect in the case that power consumption is not increased. Obviously, the display substrate of which all the sub pixel units have the same aperture area has excellent image uniformity, but is unbeneficial for reducing power consumption on the basis of ensuring reasonable image uniformity.

At least one embodiment of the present disclosure provides a display substrate which includes a base substrate and a plurality of sub pixel units arranged on the base substrate. The plurality of sub pixel units are arranged in an array and the array includes a plurality of rows and a plurality of columns, each row or each column of sub pixels includes a first sub pixel and a second sub pixel, a line segment formed by each row of sub pixels has a midpoint in a row direction or a line segment formed by each column of sub pixels has a midpoint in a column direction, the first sub pixel and the second sub pixel are used for displaying a same color, a distance from the first sub pixel to the midpoint is less than a distance from the second sub pixel to the midpoint, and an aperture area of the first sub pixel is greater than that of the second sub pixel.

According to the display substrate provided by at least one embodiment of the present disclosure, transmittance of a center region of a display panel can be promoted, the aims of promoting brightness of the center region and reducing power consumption can be fulfilled, and aperture ratios of pixels (sub pixels) of each portion in the display substrate are reasonably distributed.

Illustration will be carried out below by a few embodiments.

Embodiment 1

Figure 2A:
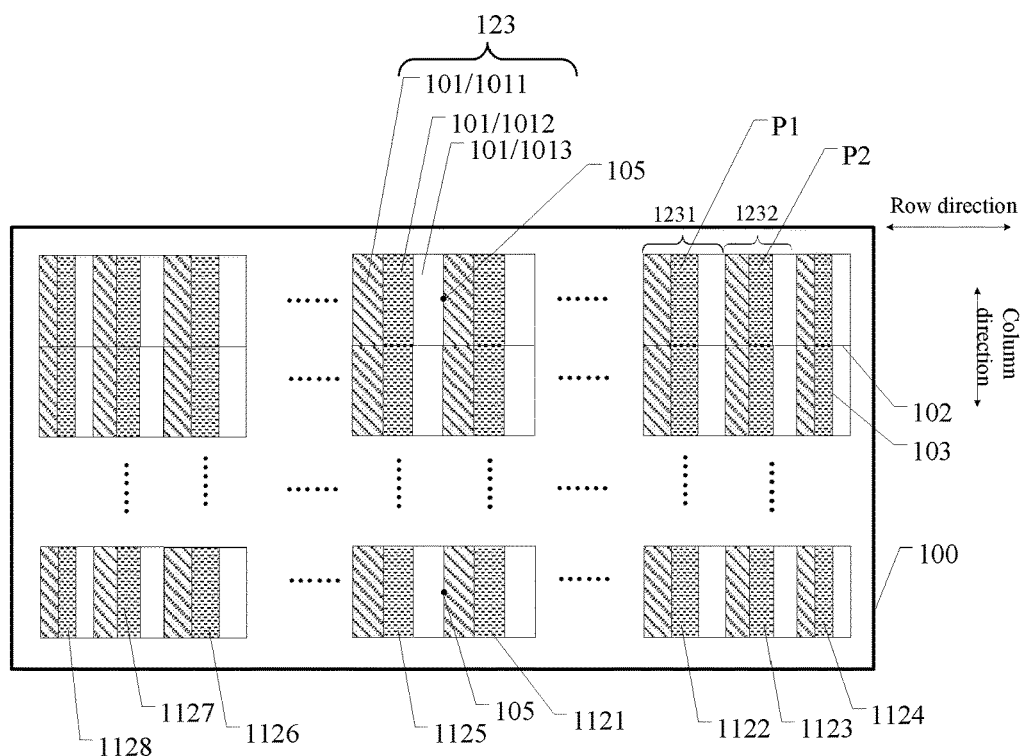
FIG. 2*a* is a schematic diagram of pixel design of a display substrate (array substrate) provided by Embodiment 1 of the present disclosure.
Figure 2B:
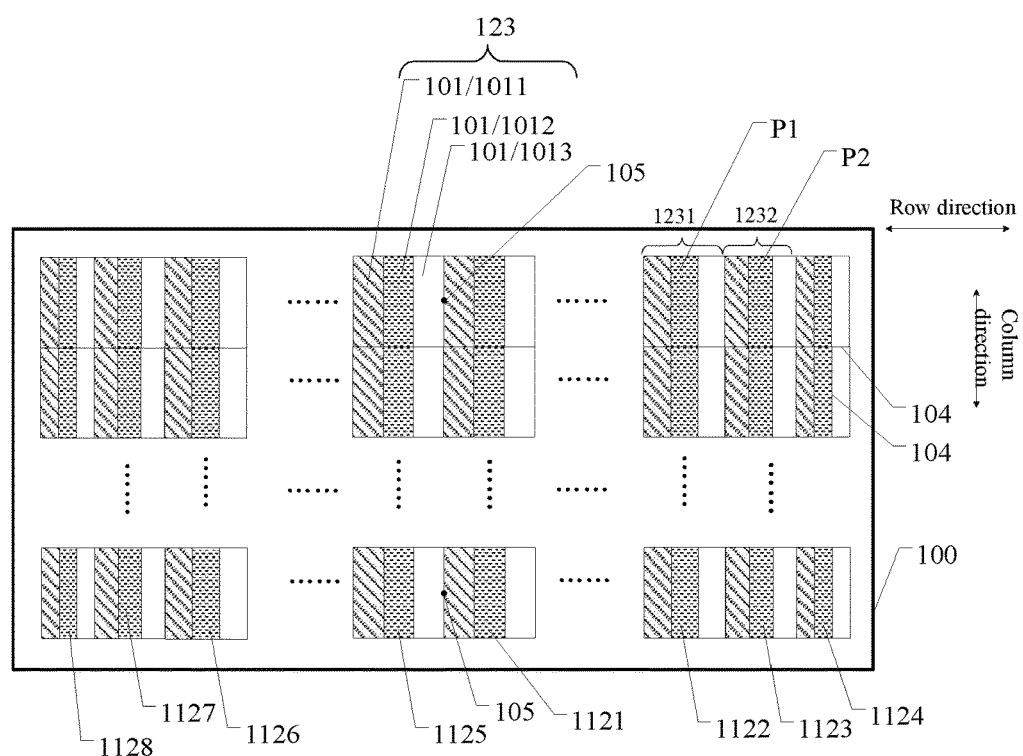
FIG. 2*b* is a schematic diagram of pixel design of a display substrate (color filter substrate) provided by Embodiment 1 of the present disclosure.

The embodiment provides a display substrate, as illustrated in FIG. 2a and FIG. 2b, including a base substrate 100 and a plurality of sub pixel units 101 arranged on the base substrate 100. The plurality of sub pixel units 101 is arranged in an array (matrix illustrated in the drawings), the array includes a plurality of rows and a plurality of columns, each row of sub pixels includes a first sub pixel P1 and a second sub pixel P2, a line segment formed by the row of sub pixels has a midpoint 105 in a row direction (or a line segment formed by sub pixels in the row of sub pixels, which are used for displaying a same color, has a midpoint 105 in the row direction), the first sub pixel P1 and the second sub pixel P2 are used for displaying a same color, a distance from the first sub pixel P1 to the midpoint 105 in the row direction is less than a distance from the second sub pixel P2 to the midpoint 105 in the row direction, and an aperture area of the first sub pixel P1 is greater than that of the second sub pixel P2.

For example, with reference to FIG. 2a and FIG. 2b, the row direction means a horizontal direction in parallel with a principal plane, and the column direction means a direction in parallel with the principal plane and perpendicular to the horizontal direction, with which each embodiment below can be the same.

For example, the aperture area of a sub pixel means a light emergent area or a light transmission area of the sub pixel. Correspondingly, an aperture area of a pixel unit means a sum of the aperture areas of all the sub pixels constituting the pixel unit. Each embodiment below can be the same.

For example, each row of sub pixels includes three colors of sub pixels which respectively are red sub pixels 1011, green sub pixels 1012 and blue sub pixels 1013. The red sub pixels 1011 are used for displaying red, the green sub pixels 1012 are used for displaying green, and the blue sub pixels 1013 are used for displaying blue. For example, one red sub pixel 1011, one green sub pixel 1012 and one blue sub pixel 1013 can constitute one pixel unit 123. However, the embodiments of the present disclosure are not limited to the above-mentioned configuration of three primary colors, and can also include other colors of sub pixels, e.g., white sub pixels.

It should be noted that in FIG. 2a and FIG. 2b, illustration is carried out by taking the case that the first sub pixel P1 and the second sub pixel P2 are green sub pixels as an example. The first sub pixel P1 and the second sub pixel P2 also can be sub pixels for displaying other colors.

FIG. 2a and FIG. 2b illustrate a plurality of sub pixel units 101 arranged in an array on the display substrate, 24 pixel units are illustrated in the drawings, and ellipses in the drawings represent other pixel units not illustrated.

It should be noted that in the embodiment, the midpoint in the row direction is an abstract point positioned at a middle position of the line segment formed by each row of sub pixels in the row direction so as to facilitate description, but is not a specific structure which objectively exists in the display substrate. Similarly, the first sub pixel and the second sub pixel are also defined by the distances relative to the midpoint in the row direction, but are not certain sub pixels particularly at certain positions. Moreover, the first sub pixel P1 and the second sub pixel P2 are not limited to be positioned on a same side of the midpoint 105 of the line segment formed by each row of sub pixels, and the first sub pixel PI and the second sub pixel P2 can be positioned on both sides of the midpoint 105 of the line segment formed by each row of sub pixels. Each embodiment below can be the same. For example, in the green sub pixels 1121 to 1128, by comparison, for the green sub pixel 1121 and the green sub pixel 1122, the green sub pixel 1121 is the first sub pixel P1, and the green sub pixel 1122 is the second sub pixel P2; for the green sub pixel 1122 and the green sub pixel 1123, the green sub pixel 1122 is the first sub pixel P1, and the green sub pixel 1123 is the second sub pixel P2; for the green sub pixel 1123 and the green sub pixel 1124, the green sub pixel 1123 is the first sub pixel P1, and the green sub pixel 1124 is the second sub pixel P2; and for the green sub pixel 1122 and the green sub pixel 1127, the green sub pixel 1122 is the first sub pixel P1, and the green sub pixel 1127 is the second sub pixel P2.

For example, as illustrated in FIG. 2a and FIG. 2b, the sub pixels which have the equal distance to the midpoint 105 in the row direction and are used for displaying a same color have the equal aperture area.

One pixel unit includes a plurality of sub pixels for displaying different colors. For example, in the plurality of sub pixels for displaying different colors included in one pixel unit, change rules of the sub pixel units for displaying different colors can be the same. For example, as illustrated in FIG. 2a and FIG. 2b, the sub pixels P1 and P2 with the above-mentioned structures respectively belong to different pixel units, so the distance from a first pixel unit 1231 (e.g., the right side in the drawings) including the sub pixel P1 to the midpoint 105 in the row direction is less than the distance from a second pixel unit 1232 (e.g., the right side in the drawings) including the sub pixel P2 to the midpoint 105 in the row direction; and the sub pixels P1 and P2 are not limited to the green sub pixels illustrated in the drawings, and also can refer to other sub pixels for displaying a same color. An aperture area of the first pixel unit 1231 is greater than that of the second pixel unit 1232.

For example, as illustrated in FIG. 2a and FIG. 2b, each row of sub pixels can have a same height. Change of the aperture areas of the sub pixels for displaying a same color can be regulated by change of widths of the sub pixels.

According to the display substrate provided by the embodiment, transmittance of a center region of a display panel can be promoted, the aims of promoting brightness of the center region and reducing power consumption can be fulfilled, and aperture ratios of pixels (sub pixels) of each portion in the display substrate are reasonably distributed.

In another example of the embodiment, as illustrated in FIG. 2a and FIG. 2b, in each row of sub pixels, from a position close to the midpoint 105 in the row direction to a position away from the midpoint 105 in the row direction, the aperture areas of all the sub pixels for displaying the same color are gradually reduced. By taking the green sub pixels 1121 to 1124 as examples, the aperture areas of the green sub pixels 1121, 1122, 1123 and 1124 are gradually reduced. The aperture areas of the sub pixels which are next to each other and are used for displaying the same color are gradually reduced, and thus, brightness of the adjacent sub pixels for displaying the same color is also gradually reduced. Therefore, when image uniformity is considered, the brightness of the center region is promoted, and brightness differences at different positions in each row are gradually changed so as to obtain a good visual effect.

For example, on each row, from the position close to the midpoint 105 in the row direction to the position away from the midpoint 105 in the row direction, the aperture areas of the red sub pixels 1011 for displaying red are gradually reduced, the aperture areas of the green sub pixels 1012 for displaying green are gradually reduced, and the aperture areas of the blue sub pixels 1013 for displaying blue are gradually reduced. Therefore, in each row, from the position close to the midpoint 105 in the row direction to the position away from the midpoint 105 in the row direction, the aperture areas of the pixel units 123 are gradually reduced. The aperture areas of the pixel units are gradually reduced, so brightness of the pixel units is also gradually reduced. Therefore, when image uniformity is considered, the brightness of the center region is promoted, and brightness differences at different positions in each row are gradually changed so as to obtain a good visual effect.

In another example of the embodiment, in each row of sub pixels, from the position close to the midpoint 105 in the row direction to the position away from the midpoint 105 in the row direction, the aperture areas of the sub pixels for displaying the same color are reduced in an arithmetic progression mode. Similarly, brightness of the adjacent sub pixels for displaying a same color is also gradually reduced in the arithmetic progression mode, and thus, the brightness of the center region is promoted, and brightness differences at different positions in each row are gradually changed in the arithmetic progression mode so as to obtain the good visual effect.

For example, in each row of sub pixels, from the position close to the midpoint 105 in the row direction to the position away from the midpoint 105 in the row direction, the aperture areas of the pixel units are reduced in the arithmetic progression mode. Similarly, brightness of the pixel units is also gradually reduced in the arithmetic progression mode, and thus, the brightness of the center region is promoted, and brightness differences at different positions in each row are gradually changed in the arithmetic progression mode so as to obtain the good visual effect.

For example, in the case that the number of the pixel units in each row is an even number, each sub pixel has an equal height and from the position close to the midpoint 105 in the row direction to the position away from the midpoint 105 in the row direction, the aperture areas of both the pixel units and the sub pixels for displaying the same color are reduced in the arithmetic progression mode, the display substrate is set to have N pixel units in each row, wherein the aperture areas of an $(N/2)^{th}$ (half of N) pixel unit and an $(N/2+1)^{th}$ (half of N plus 1) pixel unit at the center are X (a maximum pixel aperture area), a minimum pixel unit aperture area at the edge of the display substrate is set as kX, and the aperture areas of the adjacent pixel units are in an arithmetic progression relationship, so a tolerance is $(1-k)X/(N/2-1)$ and a total aperture area of the pixel units of the display substrate is $Sn=2*1/2*(kX+X)*N/2=1/2*(1+K)*X*N$. Assume that in general design (i.e., the aperture areas of all the pixels are the same), if the aperture area of each pixel is A, compared with general pixels with the same total area, a center pixel has a transmittance of $X=2A/(1+k)$ and a transmittance increasing ratio of $(X-A)/A=(2-1-k)/(1+k)=(1-k)/(1+k)$, and thus, a relationship table of a K value (i.e., a ratio obtained by dividing the maximum pixel aperture area by the minimum pixel aperture area in each row) and the transmittance increasing ratio can be obtained:

TABLE 1

Relationship Table of K Value and Transmittance Increasing Ratio

| K value | Transmittance Increasing Ratio (%) |
|---|---|
| 0.95 | 2.6 |
| 0.9 | 5.3 |
| 0.85 | 8.1 |
| 0.8 | 11.1 |

From Table I, it can be seen that the smaller K is, the higher the transmittance increasing ratio of the center of the display substrate is. In consideration of the requirement of a normal display panel for image uniformity, in a case that the K value is set as 0.8, transmittance of a center pixel unit (the sub pixel) can be promoted by 11.1%. For example, by integrating the transmittance increasing ratio and the requirement of the display panel for image uniformity, the K value can be greater than or equal to 0.8 and smaller than or equal to 0.95, and further, the K value can be greater than or equal to 0.8 and smaller than or equal to 0.9.

For example, in a display substrate provided by one embodiment of the present disclosure, in each row of sub pixels, a ratio (K value) of an aperture area of a sub pixel unit with the minimum aperture area to an aperture area of a sub pixel unit with the maximum aperture area, which is used for displaying a same color, is greater than or equal to 0.8 and smaller than 1. Similarly, in the case that change rules of the sub pixels for displaying different colors are consistent, in each row of sub pixels, the ratio (K value) of an aperture area of a pixel unit with the minimum aperture area to an aperture area of a pixel unit with the maximum aperture area is greater than or equal to 0.8 and smaller than 1.

For example, in one example of the embodiment, as illustrated in FIG. 2a and FIG. 2b, in each row of sub pixels, the first sub pixels P1 and the second sub pixels P2 are sub pixels which are next to each other and are used for displaying the same color.

For example, in the embodiment, in each column of sub pixels, aperture areas of all the sub pixels are the same. For example, in each row of sub pixels, each sub pixel has an equal height. In different rows, all the sub pixels also have the equal height. Change of the aperture area can be regulated by change of the width of each sub pixel. The width of each sub pixel, for example, means a length of the sub pixel in the row direction. The height of each sub pixel, for example, means a length of the sub pixel in the column direction.

It should be noted that in the embodiment, the display substrate can be an array substrate or a color filter substrate. Each embodiment below can be the same.

As illustrated in FIG. 2a, the display substrate is the array substrate, a gate line 102 is arranged between two adjacent sub pixel units 101 in the column direction, and a data line 103 can be arranged between two adjacent sub pixel units 101 in the row direction. The gate line 102 extends along the row direction, and the data line 103 extends along the column direction. A plurality of gate lines 102 and a plurality of data lines 103 intersect with each other to define a plurality of sub pixel units. For example, pixel electrodes also can be arranged on the array substrate, electric fields can be formed between the pixel electrodes and common electrodes to drive liquid crystal molecules to deflect (for a liquid crystal display panel, a liquid crystal layer is arranged between the array substrate and the color filter substrate) so as to implement control on light intensity, and then under the action of light filtration of the color filter substrate, display of a color image is implemented. The common electrodes can be formed on the array substrate, and also can be formed on the color filter substrate. It should be noted that the array substrate of the embodiment is not limited to be applied to the liquid crystal display panel, and for example, also can be applied to an organic electroluminescent diode display panel, and each embodiment below can be the same.

As illustrated in FIG. 2b, the display substrate is a color filter substrate, a black matrix 104 can be arranged between two adjacent sub pixel units 101 in the column direction, and the black matrix 104 also can be arranged between two adjacent sub pixel units 101 in the row direction. Namely, the black matrix is arranged between two adjacent sub pixels, and the black matrices are used for shading light to prevent crosstalk and improve contrast. For example, the black matrices 104 in the row direction have a same width, and the black matrices 104 in the column direction have a same width. For example, further, the black matrices 104 in the row direction and the black matrices 104 in the column direction have the same width. The width means a length perpendicular to an extension direction of the black matrices. Each embodiment below can be the same.

In the embodiment, in one pixel unit, the aperture areas of the sub pixel units for displaying different colors can be the same or different. Each embodiment below can be the same. In FIG. 2a and FIG. 2b, illustration is carried out by taking the case that the aperture areas of the sub pixel units for displaying different colors in one pixel unit are the same as an example.

For example, in the embodiment, the plurality of sub pixel units arranged in an array forms an axial symmetry structure. For example, a line segment formed by the midpoints of the line segments formed by all rows of sub pixels in the row direction is used as a symmetry axis, or a line segment formed by the midpoints of the line segments formed by all rows of pixel units in the row direction is used as a symmetry axis.

In the embodiment, "row" also can be replaced with "column", and correspondingly, "row direction" can be replaced with "column direction". Embodiment 2 can be the same.

Embodiment 2

Figure 3A:
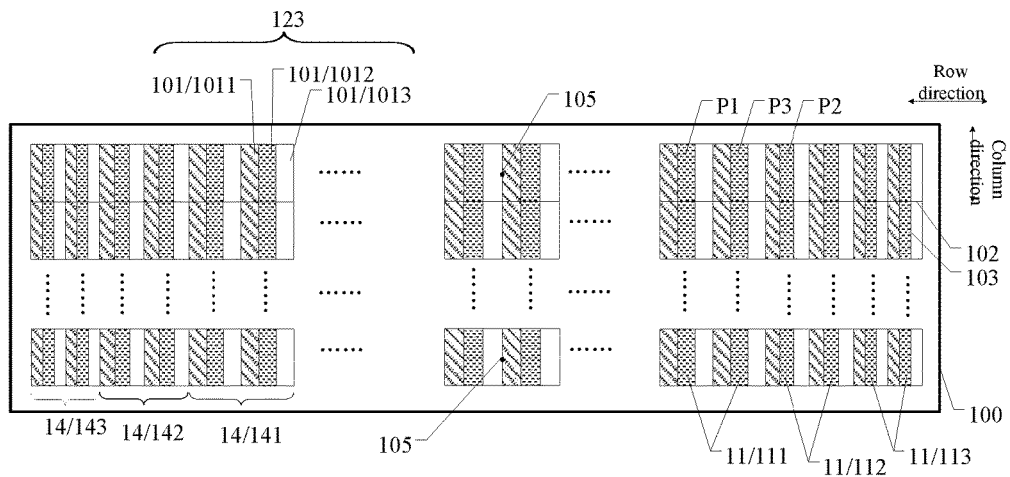
FIG. 3*a* is a schematic diagram of pixel design of a display substrate (array substrate) provided by Embodiment 2 of the present disclosure.
Figure 3B:
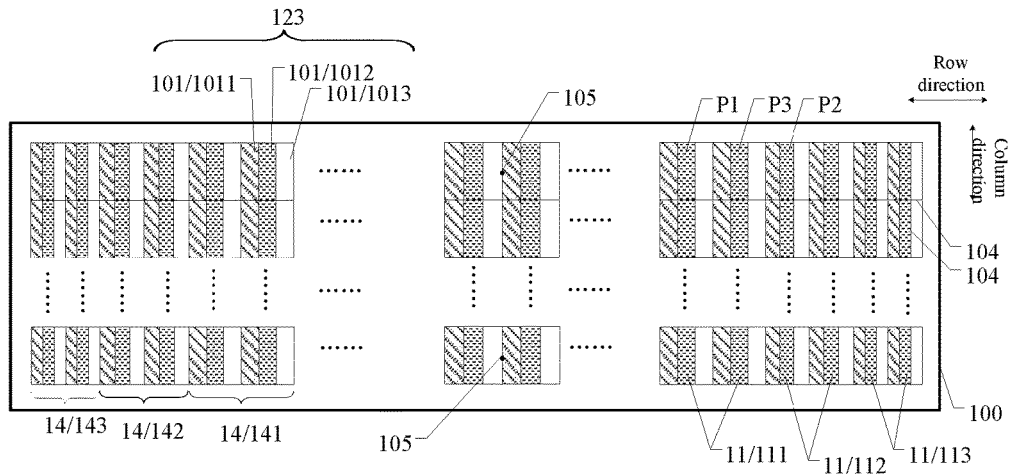
FIG. 3*b* is a schematic diagram of pixel design of a display substrate (color filter substrate) provided by Embodiment 2 of the present disclosure.

The embodiment provides a display substrate, as illustrated in FIG. 3a and FIG. 3b, including a base substrate 100 and a plurality of sub pixel units 101 arranged on the base substrate 100. The plurality of sub pixel units 101 are arranged in an array (matrix illustrated in the drawings), the array includes a plurality of rows and a plurality of columns, each row of sub pixels includes a first sub pixel P1 and a second sub pixel P2, a line segment formed by the row of sub pixels has a midpoint 105 in a row direction, the first sub pixel P1 and the second sub pixel P2 are used for displaying a same color, a distance from the first sub pixel P1 to the midpoint 105 in the row direction is less than a distance from the second sub pixel P2 to the midpoint 105 in the row direction, and an aperture area of the first sub pixel P1 is greater than that of the second sub pixel P2.

For example, as illustrated in FIG. 3a and FIG. 3b, in each row of sub pixels, the first sub pixel P1 and the second sub pixel P2 are positioned on a same side of the midpoint 105 in the row direction, at least one intermediate sub pixel P3 for displaying the same color with the first sub pixel P1 and the second sub pixel P2 is arranged between the first sub pixel P1 and the second sub pixel P2, and an aperture area of the at least one intermediate sub pixel P3 is the same with that of the first sub pixel P1 or the second sub pixel P2. In FIG. 3a and FIG. 3b, illustration is carried out by taking the case that one intermediate sub pixel P3 for displaying the same color with the first sub pixel P1 and the second sub pixel P2 is arranged between the first sub pixel P1 and the second sub pixel P2 and the aperture area of the intermediate sub pixel P3 is the same with that of the first sub pixel P1 as an example.

For example, in one example of the embodiment, as illustrated in FIG. 3a and FIG. 3b, a plurality of adjacent sub pixels for displaying a same color, which have the same aperture area, form one sub pixel unit group 11, three sub pixel unit groups 111, 112 and 113 are marked in the drawings; and in the row direction, a plurality of sub pixel unit groups formed by the sub pixels which have the same aperture area and are used for displaying the same color are also included. In each row of sub pixels, from the position close to the midpoint 105 in the row direction to the position away from the midpoint 105 in the row direction, aperture areas of the sub pixel unit groups 11 for displaying the same color are gradually reduced. For example, the aperture areas of the sub pixel unit groups 11 for displaying the same color are reduced in an arithmetic progression mode. Herein, a tolerance of an arithmetic progression can refer to description in Embodiment 1. A value of K also can refer to description in Embodiment 1. The tolerance and the K value can be the same with those in Embodiment 1.

For example, as illustrated in FIG. 3a and FIG. 3b, the adjacent pixel units with the same aperture area form one pixel unit group 14, three pixel unit groups 141, 142 and 143 are marked in the drawings; and in the row direction, a plurality of pixel unit groups formed by the pixel units with the same aperture area are also included. In each row of sub pixels, from the position close to the midpoint 105 in the row direction to the position away from the midpoint 105 in the row direction, aperture areas of the pixel unit groups 14 are gradually reduced. For example, the aperture areas of the pixel unit groups 14 are reduced in the arithmetic progression mode. For example, each pixel unit group includes two pixel units. It should be noted that each pixel unit group can also include more than two pixel units.

For example, in the embodiment, in a column direction, aperture areas of all sub pixels in the same column can be the same. For example, in each row of sub pixels, each sub pixel has an equal height; and in different rows, each sub pixel also has an equal height. Change of the aperture areas can be regulated by change of widths of the sub pixels.

In the embodiment, FIG. 3a illustrates an array substrate, FIG. 3b illustrates a color filter substrate, and related description can refer to description concerning the array substrate and the color filter substrate in Embodiment 1 and is not repeated herein.

Embodiment 3

The embodiment is different from Embodiments 1 and 2 in that: in a column direction, aperture areas of sub pixels for displaying a same color can be different. In a row direction, each sub pixel for displaying a same color can refer to description in Embodiments 1 and 2. Each pixel unit in the row direction can refer to description in Embodiments 1 and 2.

Figure 4A:
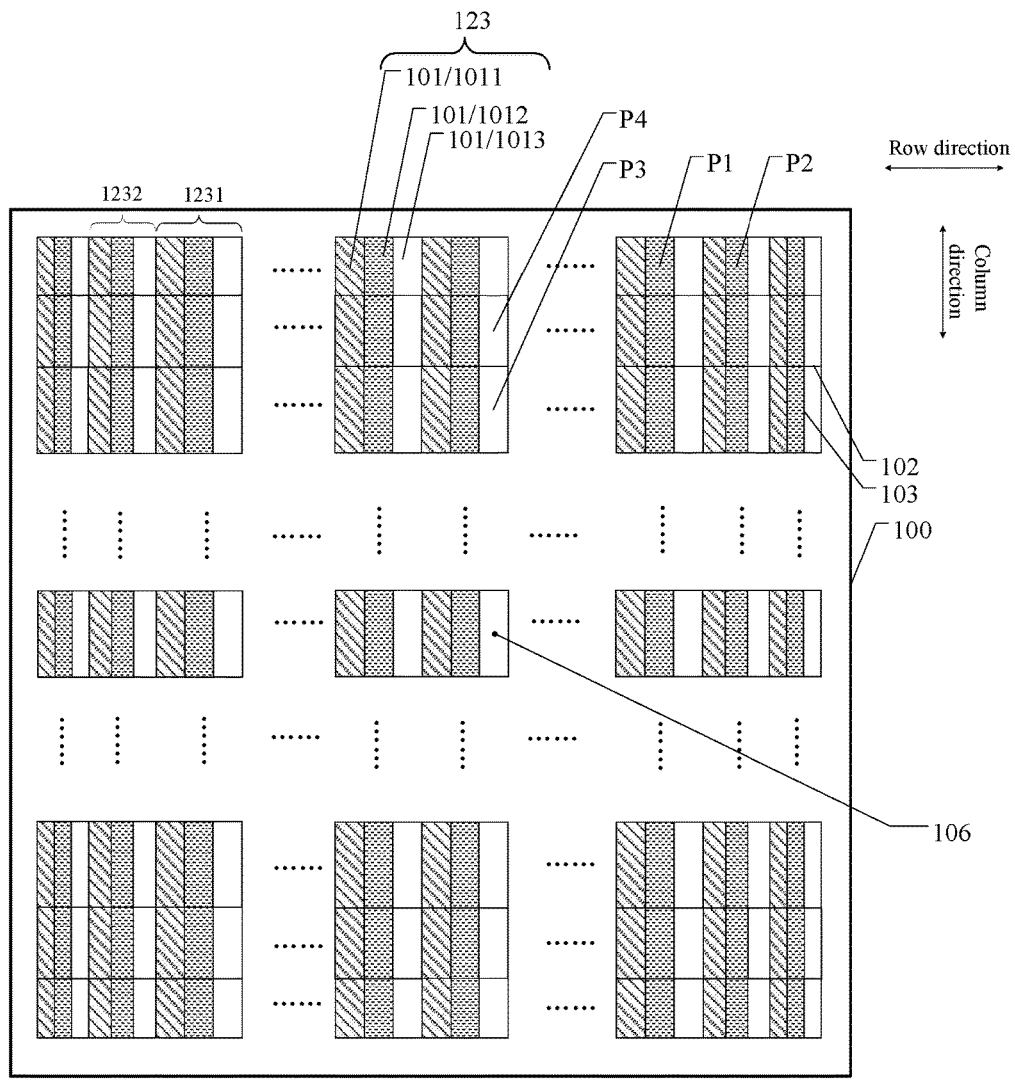
FIG. 4*a* is a schematic diagram of pixel design of a display substrate (array substrate) provided by Embodiment 3 of the present disclosure.
Figure 4B:
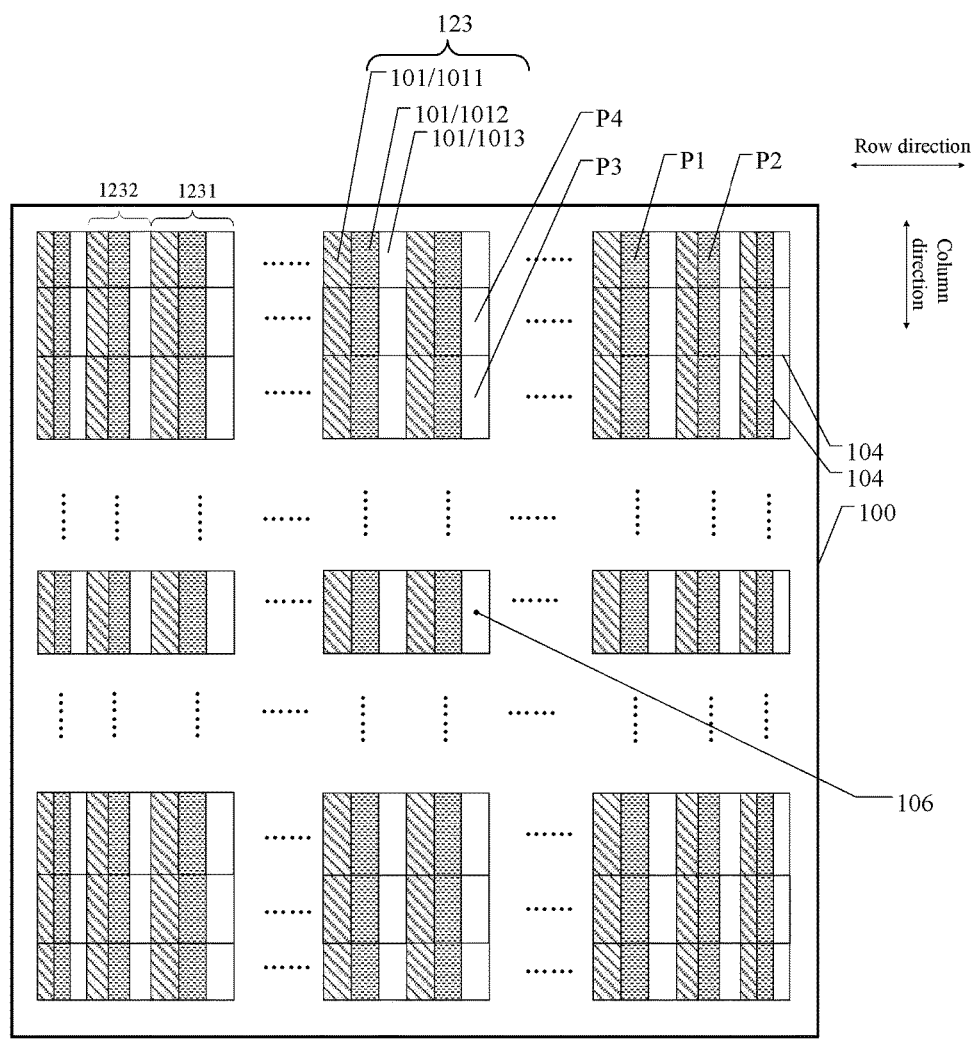
FIG. 4*b* is a schematic diagram of pixel design of a display substrate (color filter substrate) provided by Embodiment 3 of the present disclosure.

For example, in a display substrate provided by the embodiment, as illustrated in FIG. 4a and FIG. 4b, each column of sub pixels includes a third sub pixel P3 and s fourth sub pixel P4, a line segment formed by the column of sub pixels has a midpoint 106 in the column direction (or a line segment formed by sub pixel units for displaying a same color in the column of sub pixels has a midpoint 106 in the column direction), the third sub pixel P3 and the fourth sub pixel P4 are used for displaying a same color, a distance from the third sub pixel P3 to the midpoint 106 in the column direction is smaller than a distance from the fourth sub pixel P4 to the midpoint 106 in the column direction, and an aperture area of the third sub pixel P3 is greater than that of the fourth sub pixel P4.

It should be noted that in the present disclosure, the midpoint in the column direction is an abstract point positioned at a middle position of the line segment formed by each column of sub pixels in the column direction so as to facilitate description, but is not a specific structure which objectively exists in the display substrate. Similarly, the third sub pixel and the fourth sub pixel are also defined by the distances relative to the midpoints in the column direction, but are not certain sub pixels particularly at certain positions. Moreover, the third sub pixel P3 and the fourth sub pixel P4 are not limited to be positioned on a same side of the midpoint 106 of the line segment formed by each column of sub pixels, and the third sub pixel P3 and the fourth sub pixel P4 can be positioned on both sides of the midpoint 106 of the line segment formed by each column of sub pixels.

For example, in one example of the embodiment, as illustrated in FIG. 4a and FIG. 4b, in each column of sub pixels, from a position close to the midpoint 106 in the column direction to a position away from the midpoint 106 in the column direction, aperture areas of sub pixel units 101 for displaying the same color are gradually reduced.

For example, in one example of the embodiment, as illustrated in FIG. 4a and FIG. 4b, in each column of sub pixels, from the position close to the midpoint 106 in the column direction to the position away from the midpoint 106 in the column direction, aperture areas of the sub pixels for displaying the same color are reduced in an arithmetic progression mode. For example, a tolerance of an arithmetic progression herein can refer to description in Embodiment 1. A value of K also can refer to description in Embodiment 1. The tolerance and the K value can be the same with those in Embodiment 1.

The aperture areas of the sub pixels which are next to each other and are used for displaying the same color are gradually reduced, and thus, brightness of the adjacent sub pixels for displaying the same color is also gradually reduced. Therefore, when image uniformity is considered, brightness of a center region is promoted, and brightness differences at different positions on each column are gradually changed so as to obtain a good visual effect.

For example, in one example of the embodiment, in each column of sub pixels, a ratio of the aperture area of the sub pixel unit with the minimum aperture area to the aperture area of the sub pixel unit with the maximum aperture area, which is used for displaying the same color, is greater than or equal to 0.8 and smaller than 1.

For example, in one example of the embodiment, as illustrated in FIG. 4a and FIG. 4b, in each column of sub pixels, the third sub pixel P3 and the fourth sub pixel P4 are sub pixels which are next to each other and are used for displaying the same color.

In the embodiment, FIG. 4a illustrates an array substrate, FIG. 4b illustrates a color filter substrate, and related description can refer to description concerning the array substrate and the color filter substrate in Embodiment 1 and is not repeated herein.

For example, in the embodiment, the plurality of sub pixel units arranged in an array forms an axial symmetric structure. For example, a line segment formed by the midpoints of the line segments formed by all columns of sub pixels in the column direction is used as a symmetry axis, or a line segment formed by the midpoints of the line segments formed by all columns of pixel units in the column direction is used as a symmetry axis.

In the case that in Embodiment 1 or 2, "row" is replaced with "column" and "row direction" can be replaced with "column direction", in the embodiment, "column" is replaced with "row", and "column direction" is replaced with "row direction". Embodiment 4 can be the same.

Embodiment 4

Figure 5A:
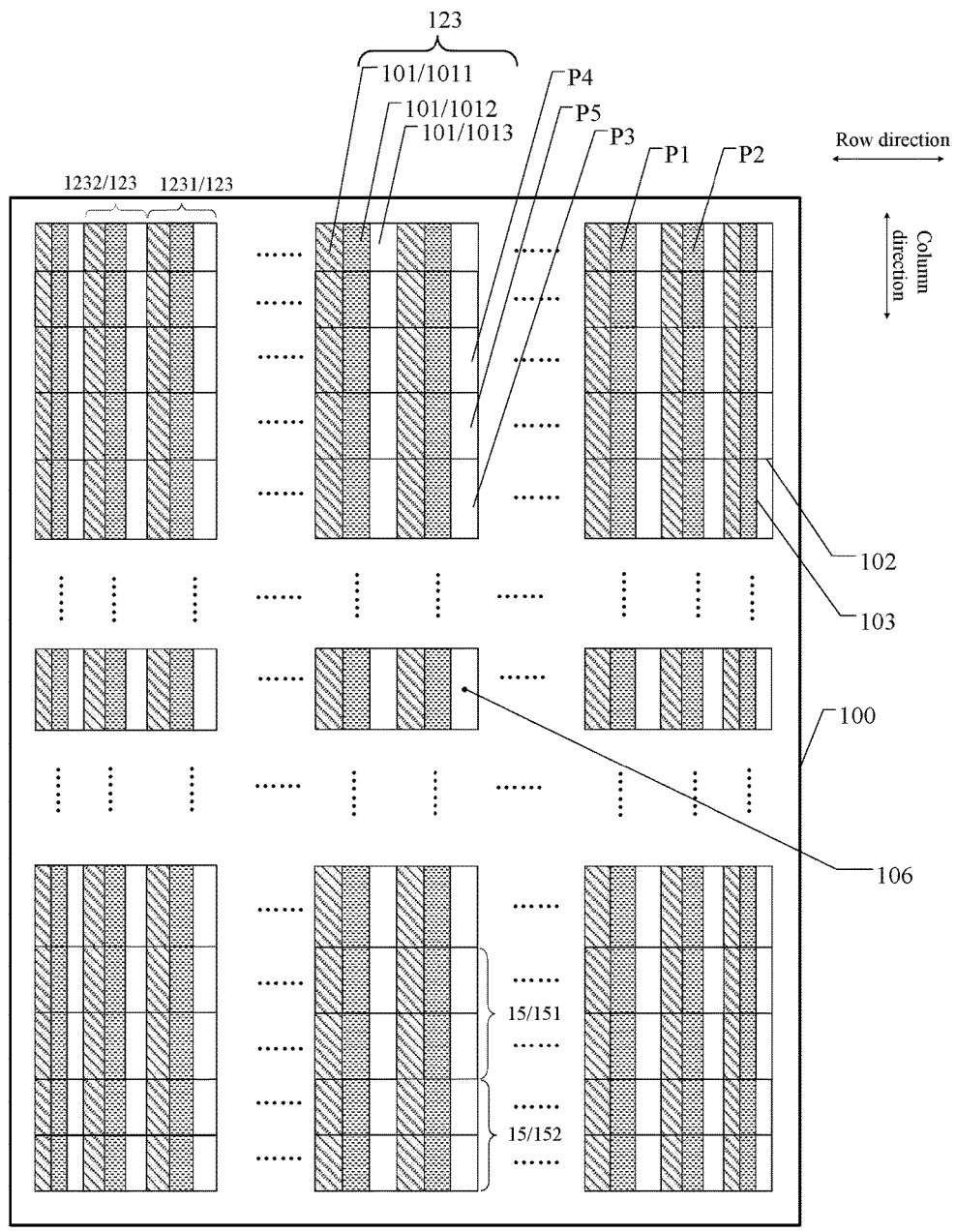
FIG. 5*a* is a schematic diagram of pixel design of a display substrate (array substrate) provided by Embodiment 4 of the present disclosure.
Figure 5B:
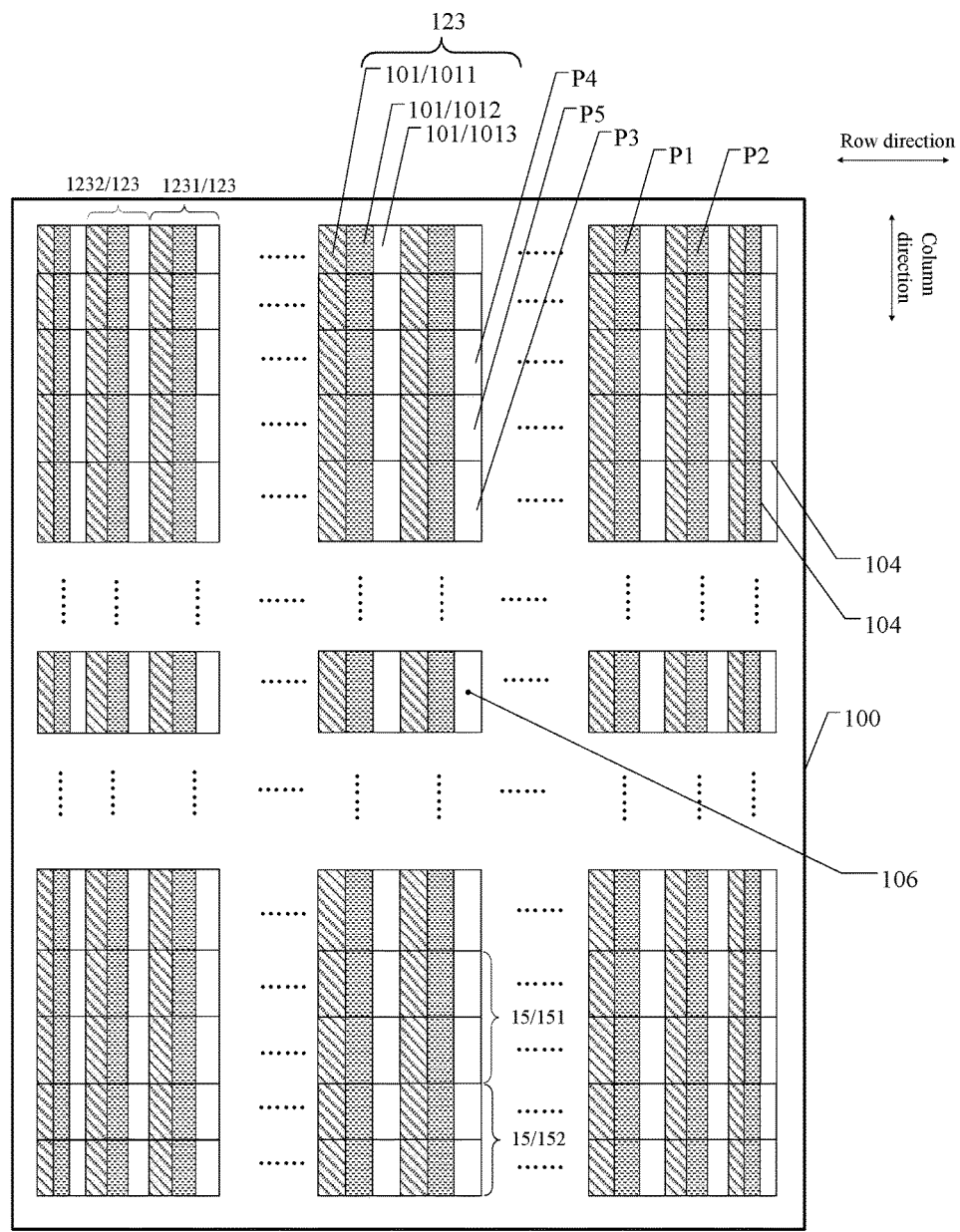
FIG. 5*b* is a schematic diagram of pixel design of a display substrate (color filter substrate) provided by Embodiment 4 of the present disclosure.

The embodiment is different from Embodiment 3 in that: in each column of sub pixels, a third sub pixel P3 and a fourth sub pixel P4 are not sub pixels which are next to each other and are used for displaying a same color, and as illustrated in FIG. 5a and FIG. 5b, at least one intermediate sub pixel P5 for displaying the same color with the third sub pixel P3 and the fourth sub pixel P4 can also be arranged between the third sub pixel P3 and the fourth sub pixel P4. The third sub pixel P3 and the fourth sub pixel P4 are positioned on a same side of the midpoint 106 in a column direction, and an aperture area of the at least one intermediate sub pixel P5 is the same with that of the third sub pixel P3 or the fourth sub pixel P4.

In FIG. 5a and FIG. 5b, illustration is carried out by taking the case that one intermediate sub pixel 5 for displaying the same color with the third sub pixel P3 and the fourth sub pixel P4 is also arranged between the third sub pixel P3 and the fourth sub pixel P4 and the aperture area of the intermediate sub pixel P5 is the same with that of the fourth sub pixel P4 as an example. The number of the intermediate sub pixels P5 can also be greater than one. Moreover, the aperture area of the intermediate sub pixel P5 also can be the same with that of the third sub pixel P3.

As illustrated in FIG. 5a and FIG. 5b, a plurality of adjacent sub pixels for displaying the same color, which have the same aperture area, form one sub pixel unit group 15, two sub pixel unit groups 151 and 152 are marked in the drawings; in the column direction, a plurality of sub pixel unit groups formed by the sub pixels which have the same aperture area and are used for displaying the same color are also included; and in each column of sub pixels, from a position close to a midpoint 106 in the column direction to a position away from the midpoint 106 in the column direction, aperture areas of the sub pixel unit groups 15 for displaying a same color are gradually reduced. For example, the aperture areas of the sub pixel unit groups 15 for displaying the same color are reduced in an arithmetic progression mode. For example, a tolerance of an arithmetic progression herein can refer to description in Embodiment 1. A value of K also can refer to description in Embodiment 1. The tolerance and the K value can be the same with those in Embodiment 1. For example, each sub pixel unit group includes the same number of sub pixels for displaying the same color.

In the embodiment, FIG. 5a illustrates an array substrate, FIG. 5b illustrates a color filter substrate, and related description can refer to description concerning the array substrate and the color filter substrate in Embodiment 1 and is not repeated herein.

Embodiment 5

The embodiment provides a display panel, including the display substrate according to any one of the above-mentioned embodiments.

For example, the display panel is a liquid crystal display panel or an organic electroluminescent diode display panel. For the liquid crystal display panel, arrangement of sub pixels on a color filter substrate corresponds to arrangement of sub pixels on the array substrate, and thus, if one of the color filter substrate and the array substrate adopts the solution of any one of the above-mentioned embodiments, the other one of the color filter substrate and the array substrate also correspondingly adopts the solution of the any one of the above-mentioned embodiments.

The display panel according to the embodiment includes the display substrate according to any one of the above-mentioned embodiments, and thus, the display panel can have the same effects with the display substrate which the display panel includes.

For example, in the liquid crystal display panel, power consumption of a Back Light Unit (BLU) generally occupies over 70% of total power consumption of a Liquid Crystal Module (LCM). Improvement on transmittance of the panel is one of the most effective modes of reducing power consumption of the BLU. In the case that the display substrate provided by any one embodiment of the present disclosure is used in the liquid crystal display panel, under the condition of not increasing power of a background light source, an important display region (a center position) can have a better display effect, and transmittance of a center region of the display panel can be promoted, so that brightness of the center region is promoted and power consumption is reduced.

Embodiment 6

The embodiment provides a display apparatus, including the display substrate according to any one of the above-mentioned embodiments.

The display apparatus provided by the embodiment includes the display substrate according to any one of the above-mentioned embodiments, and thus, the display apparatus can have the same effects with the display substrate which the display apparatus includes, which are not repeated herein.

The liquid crystal display apparatus, for example, can be any product or part with a display function, e.g., a mobile phone, a watch, a tablet computer, a television, a display, a notebook computer, a digital photo frame, a navigator and the like.

Several points below should be illustrated that:

(1) The drawings of the present disclosure only involve structures which the embodiments of the present disclosure relate to, and other structures can refer to general design. The display substrate according to the present disclosure can be prepared by combining a general method on the basis of the present disclosure.

(2) Each embodiment of the present disclosure is illustrated by taking the case that the sub pixels for displaying different colors are positioned on a same row as an example, but the embodiments of the present disclosure are not limited thereto. The sub pixels for displaying different colors also can be positioned in the same column of sub pixels.

(3) Each embodiment of the present disclosure is illustrated by taking the case that each pixel unit includes three primary colors of red, green and blue, but is not limited thereto.

(4) Except a plurality of sub pixel units of the structure in each embodiment of the present disclosure, the display substrate further can include other sub pixel units, which is not limited by the present disclosure.

(5) In the present disclosure, "row" and "column" in the array can be replaced with each other.

(6) In case of no conflict, characteristics in the same embodiment or different embodiments of the present disclosure can be mutually combined.

The foregoing embodiments merely are specific embodiments of the disclosure, and not intended to define the scope of the disclosure, and any variations or replacements which can be easily thought of by those skilled in the art in the technical scope of the disclosure shall fall within the scope of disclosure. Therefore, the scope of the disclosure shall be determined by the scope of the appended claims.

The present application claims priority of the Chinese Patent Application No. 201510796793.7 filed on Nov. 18, 2015, the disclosure of which are incorporated herein by its reference in its entirety as part of the present application.

The invention claimed is:

1. A display substrate, comprising a base substrate and a plurality of sub pixel units arranged on the base substrate,
wherein the plurality of sub pixel units is arranged in an array, and the array includes a plurality of rows and a plurality of columns,
each row and each column of sub pixels includes a first sub pixel and a second sub pixel, a line segment formed by the row of sub pixels has a midpoint in a row direction and a line segment formed by the column of sub pixels has a midpoint in a column direction, the first sub pixel and the second sub pixel are configured for displaying a same color, a distance from the first sub pixel to the midpoint is less than a distance from the second sub pixel to the midpoint, and an aperture area of the first sub pixel is greater than that of the second sub pixel,
wherein in each row of sub pixels, from a position close to the midpoint in the row direction to a position away from the midpoint in the row direction, and in each column of sub pixels, from a position close to the midpoint in the column direction to a position away from the midpoint in the column direction, the aperture areas of the sub pixels for displaying the same color are reduced in an arithmetic progression mode,
wherein, the midpoint in the row direction is at an interface between adjacent two of the sub pixels.

2. The display substrate according to claim 1, wherein in each row or each column of sub pixels, the first sub pixel and the second sub pixel are sub pixels which are next to each other and are configured for displaying the same color.

3. The display substrate according to claim 2, wherein each row of sub pixels includes the first sub pixel and the second sub pixel, the distance from the first sub pixel to the midpoint in the row direction is less than the distance from the second sub pixel to the midpoint in the row direction, each column of sub pixels includes a third sub pixel and a fourth sub pixel, a line segment formed by the column of sub pixels has a midpoint in the column direction, the third sub pixel and the fourth sub pixel are configured for displaying a same color, a distance from the third sub pixel to the midpoint in the column direction is less than a distance from the fourth sub pixel to the midpoint in the column direction, an aperture area of the third sub pixel is greater than that of the fourth sub pixel.

4. The display substrate according to claim 2, further comprising black matrices for separating the sub pixel units, wherein the black matrices have a same width.

5. The display substrate according to claim 1, wherein in each row of sub pixels, the first sub pixel and the second sub pixel are positioned on a same side of the midpoint in the row direction, or in each column of sub pixels, the first sub pixel and the second sub pixel are positioned on a same side of the midpoint in the column direction, at least one intermediate sub pixel for displaying the same color with the first sub pixel and the second sub pixel is arranged between the first sub pixel and the second sub pixel, and an aperture area of the at least one intermediate sub pixel is the same with that of the first sub pixel or the second sub pixel.

6. The display substrate according to claim 1, wherein each row of sub pixels includes the first sub pixel and the second sub pixel, the distance from the first sub pixel to the midpoint in the row direction is less than the distance from the second sub pixel to the midpoint in the row direction, each column of sub pixels includes a third sub pixel and a fourth sub pixel, a line segment formed by the column of sub pixels has a midpoint in the column direction, the third sub pixel and the fourth sub pixel are configured for displaying a same color, a distance from the third sub pixel to the midpoint in the column direction is less than a distance from the fourth sub pixel to the midpoint in the column direction, an aperture area of the third sub pixel is greater than that of the fourth sub pixel.

7. The display substrate according to claim 6, wherein in each column of sub pixels, the third sub pixel and the fourth sub pixel are sub pixels which are next to each other and are configured for displaying the same color.

8. The display substrate according to claim 6, wherein in each column of sub pixels, the third sub pixel and the fourth sub pixel are positioned on a same side of the midpoint in the column direction, at least one intermediate sub pixel for displaying the same color with the third sub pixel and the fourth sub pixel is arranged between the third sub pixel and the fourth sub pixel, and an aperture area of the at least one intermediate sub pixel is the same with that of the third sub pixel or the fourth sub pixel.

9. The display substrate according to claim 1, wherein in each column of sub pixels, from the position close to the midpoint in the column direction to the position away from the midpoint in the column direction, the aperture areas of the sub pixels for displaying the same color are gradually reduced in an arithmetic progression mode.

10. The display substrate according to claim 1, wherein in each column of sub pixels, a ratio of an aperture area of the sub pixel unit with a minimum aperture area to an aperture area of the sub pixel unit with a maximum aperture area, which is configured for displaying the same color, is greater than or equal to 0.8 and less than 1.

11. The display substrate according to claim 1, further comprising black matrices for separating the sub pixel units, wherein the black matrices have a same width.

12. The display substrate according to claim 1, wherein the aperture areas of the adjacent sub pixel units for displaying different colors are the same or different.

13. The display substrate according to claim 1, wherein the display substrate is an array substrate or a color filter substrate.

14. The display substrate according to claim 1, in each row or each column of sub pixels, a ratio of an aperture area of the sub pixel unit with a minimum aperture area to an aperture area of the sub pixel unit with a maximum aperture area, which is configured for displaying the same color, is greater than or equal to 0.8 and less than 0.9.

15. A display panel, comprising the display substrate according to claim 1.

16. The display panel according to claim 15, wherein the display panel is a liquid crystal display panel or an organic electroluminescent diode display panel.

17. A display apparatus, comprising the display substrate according to claim 1.

* * * * *